(12) United States Patent
Yang et al.

(10) Patent No.: US 9,929,069 B2
(45) Date of Patent: Mar. 27, 2018

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Tien-Chung Yang, Hsinchu (TW); Lin-Chih Huang, Hsinchu (TW); Hsien-Wei Chen, Hsinchu (TW); An-Jhih Su, Taoyuan County (TW); Li-Hsien Huang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/380,499

(22) Filed: Dec. 15, 2016

(65) Prior Publication Data

US 2017/0098588 A1   Apr. 6, 2017

Related U.S. Application Data

(62) Division of application No. 14/828,946, filed on Aug. 18, 2015, now Pat. No. 9,564,345.

(51) Int. Cl.
*H01L 23/48* (2006.01)
*H01L 23/31* (2006.01)
(Continued)

(52) U.S. Cl.
CPC ........ *H01L 23/3114* (2013.01); *H01L 21/565* (2013.01); *H01L 23/485* (2013.01); *H01L 23/4824* (2013.01); *H01L 24/03* (2013.01); *H01L 24/11* (2013.01); *H01L 24/13* (2013.01); *H01L 24/94* (2013.01); *H01L 2021/60022* (2013.01); *H01L 2224/0391* (2013.01);
(Continued)

(58) Field of Classification Search
CPC . H01L 23/3114; H01L 23/4824; H01L 23/485
See application file for complete search history.

(56) References Cited

U.S. PATENT DOCUMENTS 6,429,523 B1   8/2002   Andricacos et al.
8,361,842 B2   1/2013   Yu et al.
(Continued)

FOREIGN PATENT DOCUMENTS

JP   2006310426 A   11/2006

OTHER PUBLICATIONS

Notice of Allowance of the corresponding Korean 10-2015-0164425 dated Apr. 18, 2017.
(Continued)

*Primary Examiner* — Douglas Menz
(74) *Attorney, Agent, or Firm* — WPAT, P.C., Intellectual Property Attorneys; Anthony King

(57) ABSTRACT

A method of manufacturing a semiconductor device includes providing a semiconductor substrate including a conductive pad disposed thereon; disposing a polymeric material over the semiconductor substrate and the conductive pad; patterning the polymeric material to form an opening exposing at least a portion of the conductive pad; disposing a conductive layer over the polymeric material and the portion of the conductive pad; and forming a conductor over the portion of the conductive pad and within the opening.

20 Claims, 4 Drawing Sheets

(51) Int. Cl.
　　　*H01L 23/482*　　(2006.01)
　　　*H01L 23/485*　　(2006.01)
　　　*H01L 23/00*　　　(2006.01)
　　　*H01L 21/56*　　　(2006.01)
　　　*H01L 21/60*　　　(2006.01)

(52) U.S. Cl.
　　　CPC ............... *H01L 2224/10126* (2013.01); *H01L 2224/11013* (2013.01); *H01L 2224/11466* (2013.01); *H01L 2224/11602* (2013.01); *H01L 2224/13005* (2013.01); *H01L 2224/13026* (2013.01)

(56) References Cited

U.S. PATENT DOCUMENTS

| | | |
|---|---|---|
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2011/0291288 A1 | 12/2011 | Wu et al. |
| 2012/0326299 A1 | 12/2012 | Topacio et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0264684 A1 | 10/2013 | Yu et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |

OTHER PUBLICATIONS

English translation of Notice of Allowance of the corresponding Korean 10-2015-0164425 dated Apr. 18, 2017.
English abstract translation of JP 2006310426.

SEMICONDUCTOR DEVICE AND MANUFACTURING METHOD THEREOF

PRIORITY CLAIM AND CROSS-REFERENCE

This application claims priority to U.S. application Ser. No. 14/828,946, filed on Aug. 18, 2015, entitled "Semiconductor Device and Manufacturing Method Thereof," which application is hereby incorporated herein by reference.

BACKGROUND

Electronic equipments involving semiconductor devices are indispensable from our daily life. With the advancement of electronic technology, electronic equipments become more complicated and involve greater amount of integrated circuitry for executing the desired multi-functionality. Thus, manufacturing of the electronic equipments includes more and more steps of assembly and processing as well as materials for producing the semiconductor devices in the electronic equipments. Therefore, there is a continuous demand on simplifying the steps of production, increasing production efficiency and lowering associated manufacturing cost on each electronic equipment.

During the operations of manufacturing the semiconductor devices, the semiconductor devices are assembled with numbers of integrated components including various materials with difference in thermal properties. As such, the integrated components are in undesired configurations. The undesired configurations would lead to yield loss of the semiconductor devices, poor bondability between the components, development of cracks, delamination of the components or etc. Furthermore, the components of the semiconductor devices include various metallic materials which are in limited quantity and thus in a high cost. The undesired configurations of the components and the yield loss of the semiconductor devices would further exacerbate materials wastage and thus the manufacturing cost would increase.

As more different components with different materials are involved and a complexity of the manufacturing operations of the semiconductor device is increased, there are more challenges to modify a structure of the semiconductor device and improve the manufacturing operations. As such, there is a continuous need to improve the method for manufacturing the semiconductor and solve the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
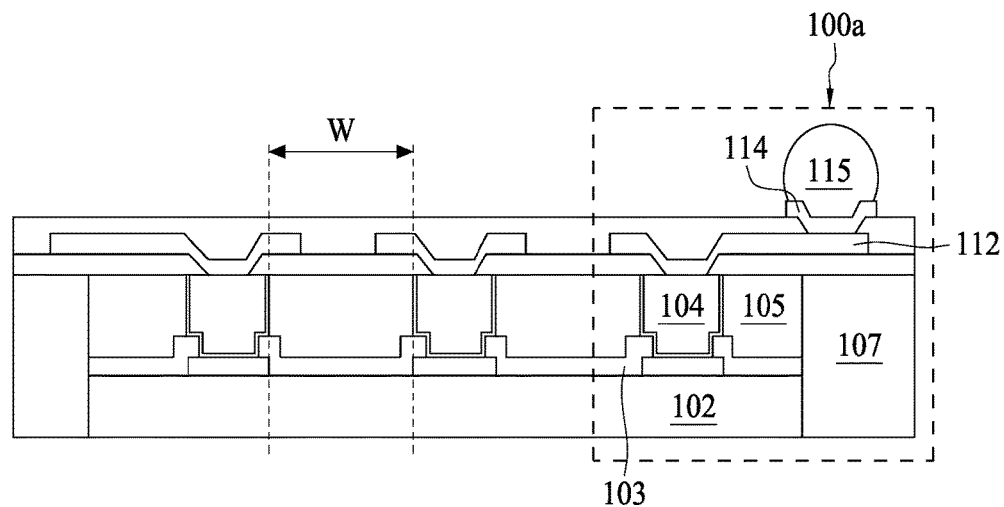
FIG. 1 a schematic view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
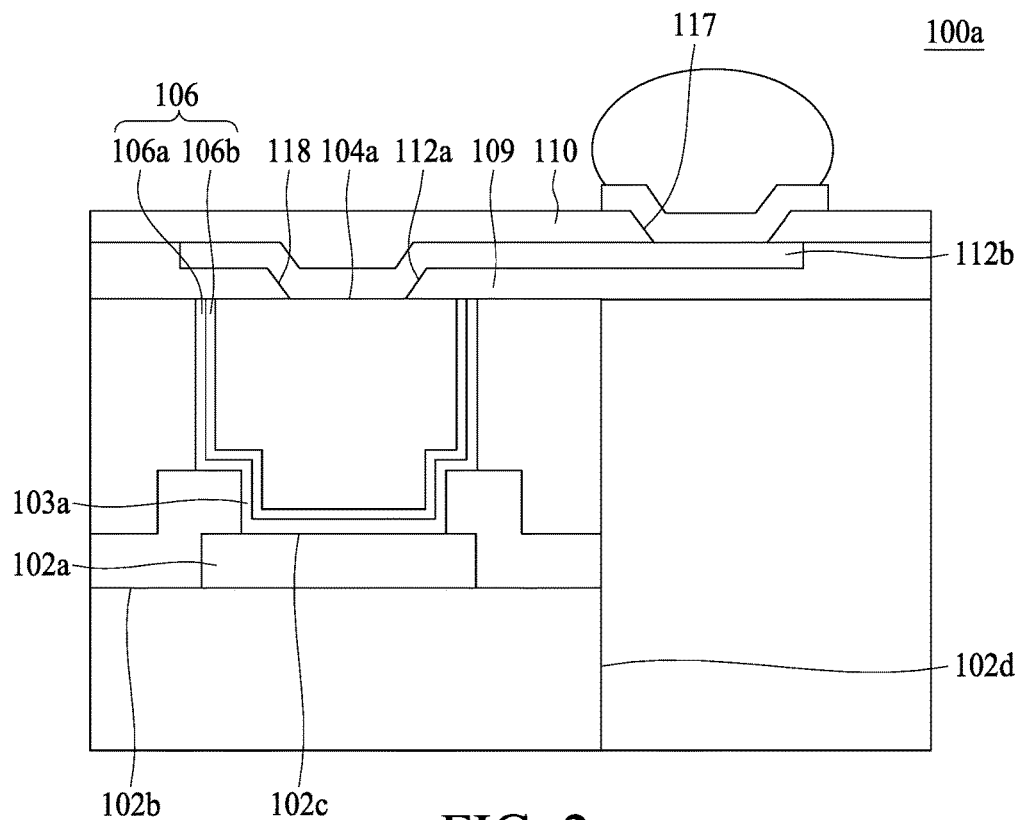
FIG. 2 is an enlarged view of a portion of a semiconductor device in FIG. 1 in accordance with some embodiments.

FIG. 1 is an embodiment of a semiconductor device 100 and 100a is a portion of the semiconductor device 100 in FIG. 1. FIG. 2 is an enlarged view of 100a. Semiconductor device 100a includes a semiconductor substrate 102. In some embodiments, the semiconductor substrate 102 includes semiconductor materials such as silicon, and is fabricated with a predetermined functional circuit within the semiconductor substrate 102 produced by various operations such as photolithography, etch, deposition, plating, etc. In some embodiments, the semiconductor substrate 102 is singulated from a silicon wafer by a mechanical or laser blade. In some embodiments, the semiconductor substrate 102 is in a quadrilateral, a rectangular or a square shape.

The semiconductor substrate 102 includes a surface 102b and a conductive pad 102a is disposed on the surface 102b.

In some embodiments, the conductive pad 102a is electrically connected with a circuitry external to the semiconductor substrate 102, so that a circuitry internal to the semiconductor substrate 102 electrically connects with the circuitry external to the semiconductor substrate 102 through the conductive pad 102a. In some embodiments, the conductive pad 102a is configured for electrically coupling with a conductive bump through a conductive trace attached on the conductive pad 102a, so that the circuitry internal to the semiconductor substrate 102 connects with the circuitry external to the semiconductor substrate 102 from the conductive pad 102a to the conductive bump through the conductive trace. In some embodiments, the conductive pad 102a includes gold, silver, copper, nickel, tungsten, aluminum, palladium and/or alloys thereof.

In some embodiments, a passivation 103 is disposed on the surface 102b of the semiconductor substrate 102 and over the conductive pad 102a. In some embodiments, the passivation 103 surrounds the conductive pad 102a. In some embodiments, the passivation 103 partially covers a top surface 102c of the conductive pad 102a. The passivation 103 is configured for providing an electrical insulation and a moisture protection for the semiconductor substrate 102, so that the semiconductor substrate 102 is isolated from ambient environment. In some embodiments, the passivation 103 is formed with dielectric materials such as spin-on glass (SOG), silicon oxide, silicon oxynitride, silicon nitride or the like. In some embodiments, the passivation 103 is formed with a vapor deposition or a spin coating process.

In some embodiments, the passivation 103 includes an opening 103a above the conductive pad 102a for exposing a portion of the top surface 102c of the conductive pad 102a and thus for electrically connecting the conductive pad 102a with the circuitry external to the semiconductor substrate 102 through the conductive trace.

In some embodiments, several conductors 104 are disposed over the top surface 102c of the conductive pad 102a as in FIG. 1 with a spacing W being less than about 10 um. In some embodiments, each conductor 104 is on an exposed portion of the top surface 102c and a portion of the passivation 103 adjacent to the opening 103a. The conductor 104 is extended from the exposed portion of the top surface 102c to a top surface 104a of the conductor 104 as in FIG. 2. In some embodiments, the conductor 104 is extended along a normal direction of the surface 102b. In some embodiments, the conductor 104 is substantially upright and supported by the conductive pad 102a.

In some embodiments, the conductor 104 is in a cylindrical shape with various cross-sectional shapes such as circular shape, quadrilateral shape or polygonal shape. In addition, a wide variety of materials is selected for the conductor 104 such as metal or metal alloy. In some embodiments, the conductor 104 includes copper (Cu), gold (Au), platinum (Pt), titanium (Ti), nickel (Ni), aluminum (Al), etc.

In some embodiments, a polymeric material 105 is disposed over the passivation 103 and surrounding the conductor 104. The polymeric material 105 is a dielectric filling inserted around the conductor 104 in order to isolate adjacent conductors or avoid moisture attack. In some embodiments, the polymeric material 105 includes a material such as epoxy, polyimide, polybenzoxazole (PBO), solder resist (SR), ABF film, and the like. In some embodiments, the conductor 104 and polymeric material 105 are substantially coplanar.

In some embodiments, an electric conductive layer 106 is disposed between the conductor 104 and the polymeric material 105. The electric conductive layer 106 is a layer may be substantially thinner than the conductor 104 and is extended along a longitudinal sidewall of the conductor 104. In FIG. 2, the longitudinal sidewall is defined as the surface extends along the normal direction of the surface 102b. The electric conductive layer 106 is sandwiched by the conductor 104 and the polymeric material 105 so as to form a barrier to prevent a direct contact between the conductor 104 and the polymeric material 105. The electric conductive layer 106 is a continuous film and surrounds the longitudinal sidewall of conductor 104 as the polymeric material 105. In some embodiment, the electric conductive layer 106 includes an element which has at least a different physical or chemical property than the conductor 104.

In some embodiment, the electric conductive layer 106 includes an element having a different standard electrode potential than the conductor 104. In some embodiments, the electric conductive layer 106 includes an element tending to grab the oxygen atoms from the polymeric material 105 more aggressively than the conductor 104. An oxide compound of the element may form between the electric conductive layer 106 and the polymeric material 105. The oxide compound provides a glue to further bond the conductor 104 and the polymeric material 105 in a more secured way. The electric conductive layer 106 also includes an element which may forms a coherent layer between the electric conductive layer 106 and the conductor 104. In order to possess two different characteristics, the electric conductive layer 106 may be a composite structure including several conductive layers.

As in FIG. 2, the electric conductive layer 106 includes at least two layers, layer 106a and layer 106b. The layer 106a is more adjacent to the polymeric material 105 comparing to layer 106b and the layer 106a serves the element to form the oxide compound between the electric conductive layer 106 and the polymeric material 105. The layer 106b is more adjacent to the conductor 104 comparing to layer 106a and layer 106b serves the element to form the coherent layer.

In some embodiment, the standard electrode potential ratio between layer 106a and conductor 104 is between about 2.1 and about 7.5. In some embodiment, the standard electrode potential ratio between layer 106a and conductor 104 is between about 4.0 and about 5.0. In some embodiment, the standard electrode potential ratio between layer 106a and conductor 104 is between about 4.3 and about 4.7. The layer 106a may include element such as, Ti, Cr, Al, doped-Si, Zr, Th, Ni, etc.

In some embodiment, the standard electrode potential ratio between layer 106b and conductor 104 is between about 0.85 and about 1.35. In some embodiment, the standard electrode potential ratio between layer 106b and conductor 104 is between about 0.91 and about 1.07. The layer 106b may include element such as, Pt, Au, Ag, Cu, etc.

In some embodiments, the electric conductive layer 106b includes an element having a an adhesion strength between the electric conductive layer 106 and the polymeric material 105 greater than an adhesion strength between the polymeric material 105 and the conductor 104. In some embodiments, the adhesion strength may be referred to as a quantitative interfacial energy. The quantitative interfacial energy defines as the quantitative energy value of two specific substances. The magnitude of the value represents the adhesion strength between the two specific substances. Higher quantitative interfacial energy indicates that a greater adhesion strength between the two specific substances.

In the present disclosure, the conductive layer 106 acts as a reinforce structure between conductor 104 and polymeric material 105. The conductive layer 106 possesses a quantitative interfacial energy higher than the quantitative interfacial energy between the polymeric material 105 and the conductor 104. The inserted conductive layer 106 separates the conductor 104 from directly contacting the polymeric material 105; therefore a delamination between the conductor 104 and polymeric material 105 is prevented. In some embodiments, the adhesion strength between layer 106a and polymeric material 105 may be greater than the adhesion strength between layer 106b and polymeric material 105.

In some embodiments, a ratio of atomic weight between layer 106a and layer 106b may be about 0.6 to about 1.3. In some embodiments, a ratio of atomic weight between layer 106a and layer 106b is about 0.65 to about 0.9. In some embodiments, a ratio of atomic weight between layer 106a and layer 106b is about 0.70 to about 0.85.

In some embodiments, a ratio of atomic weight between the layer 106b and the conductor 104 may be about 0.8 to about 1.2. In some embodiments, a ratio of atomic weight between the layer 106b and the conductor 104 may be about 0.9 to about 1.1. In some embodiments, a ratio of atomic weight between the layer 106b and the conductor 104 may be about 0.95 to about 1.05. In some embodiments, the layer 106b may be made with a same material as the conductor 104 but with different micro structure, such as crystal orientation, or grain size. In some embodiments, the grain size of the layer 106b may be greater than the grain size of the conductor 104. In some embodiments, thickness of the 106a is substantially greater than 50 nm, and thickness of layer 106b is substantially greater than 100 nm. In some embodiments, a ratio of the thickness between the layer 106a and the layer 106b may be about 1:1 to 1:3.

The electric conductive layer 106 may be further extended under the bottom surface of the conductor 104. In some embodiments, a portion of the electric conductive layer 106 is disposed between the conductive pad 102a and the conductor 104. In some embodiments, the electric conductive layer 106 is disposed between the passivation 103 and the conductor 104. In some embodiments, the electric conductive layer 106 is a continuous film surrounding the conductor 104. In some embodiments, the electric conductive layer 106 has a width of about 150 nm to about 250 nm. In some embodiments, a wide variety of materials is selected for the electric conductive layer 106 such as metal or metal alloy.

In some embodiments, a molding 107 is disposed to surround the semiconductor substrate 102. In some embodiments, the molding 107 is disposed adjacent to a sidewall 102d of the semiconductor substrate 102. In some embodiments, top surfaces of the conductor 104, polymeric material 105 and the molding 107 are substantially coplanar.

In some embodiments, the semiconductor device 100 includes a polymer 109 disposed over the molding 107, the conductor 104 and the polymeric material 105. A recessed portion 118 of the polymer 109 is formed above the top surface 104a of the conductor 104 as in FIG. 2. In some embodiments, the semiconductor device 100 further includes a first redistribution layer (RDL) 112 disposed on the conductor 104 and polymer 109 as in FIG. 2. In some embodiments, the semiconductor device 100 further includes a polymer 110 disposed over the polymer 109 and the first redistribution layer 112 as in FIG. 2. In some embodiments, the semiconductor device 100 further includes a via 117 formed above an end portion 112b of the first redistribution layer 112, and a bond pad 114 is disposed on the polymer 110 and first redistribution layer 112 as in FIG. 2. In some embodiments, the semiconductor device 100 further includes a bump 115 disposed on the bond pad 114 as in FIG. 2.

FIG. 3A-FIG. 3K is an embodiment of a method of manufacturing semiconductor device. The method includes a number of operations (201, 202, 203, 204, 205, 206, 207, 208, 209, 210, and 211).

Figure 3A:
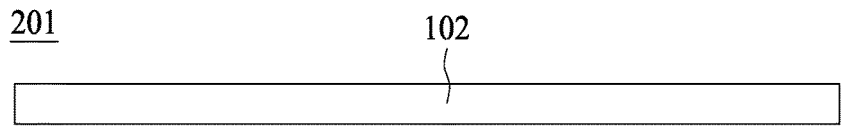
FIG. 3A is a schematic view of a semiconductor device with a semiconductor substrate in accordance with some embodiments.
Figure 3B:
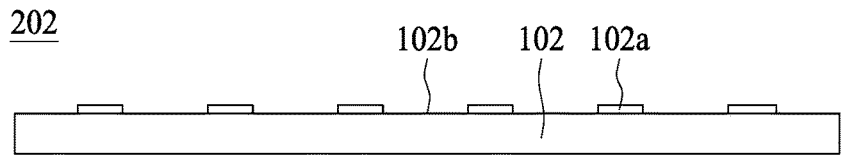
FIG. 3B is a schematic view of a semiconductor device with a conductive pad in accordance with some embodiments.

In operation 201, a semiconductor substrate 102 is provided as in FIG. 3A. In some embodiments, the semiconductor substrate 102 includes semiconductor material such as silicon. In operation 202, a conductive pad 102a is formed on the semiconductor substrate 102 as in FIG. 39. In some embodiments, the conductive pad 102a is disposed on a surface 102b of the semiconductor substrate 102.

Figure 3C:
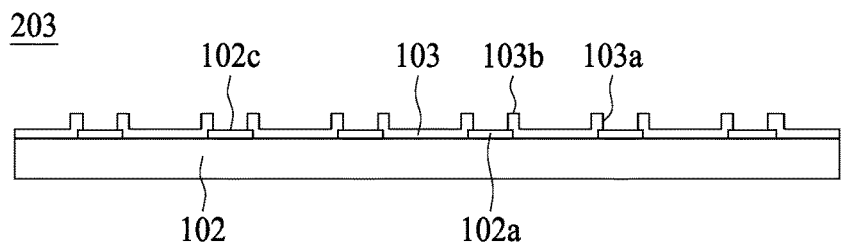
FIG. 3C is a schematic view of a semiconductor device with a passivation in accordance with some embodiments.

In operation 203, a passivation 103 is disposed over the semiconductor substrate 102, and some of the passivation 103 is removed to form an opening 103a as in FIG. 3C. In some embodiments, some of the passivation 103 above a top surface 102c of the conductive pad 102a is removed by etching operations to expose the top surface 102c of the conductive pad 102a and form the opening 103a. In some embodiments, the opening 103a is extended from a top surface 103b of the passivation 103 to the top surface 102c of the conductive pad 102a.

Figure 3D:
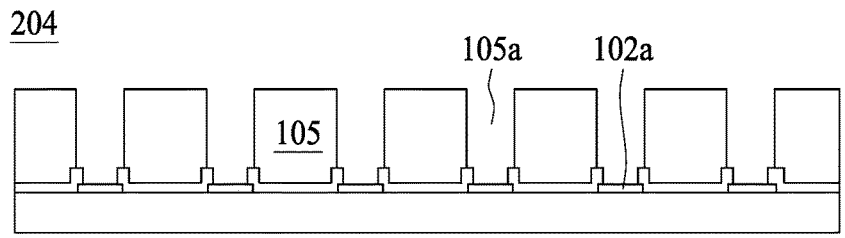
FIG. 3D is a schematic view of a semiconductor device with a polymeric material in accordance with some embodiments.

In operation 204, a polymeric material 105 is disposed over conductive pad 102a and the passivation 103, and the polymeric material 105 is patterned with an opening 105a above the conductive pad 102a as in FIG. 3D. In some embodiments, the width of the opening 105a is between about 10 um and about 100 um. The polymeric material 105 is patterned to provide a path for a conductive material or conductive trace passing through. In some embodiments, the polymeric material 105 is patterned to form the opening 105a by photolithography, and several polymeric blocks are formed as FIG. 3D. The spacing between adjacent polymeric blocks may be 40 um to 100 um. In some embodiments, a photoresist material is disposed to cover the polymeric material 105, and then the photoresist material is partially exposed through a photomask in order to etch away those polymeric material 105 adjacent to or over the conductive pad 102a, so that the opening 105a is formed above the conductive pad 102a.

Figure 3E:
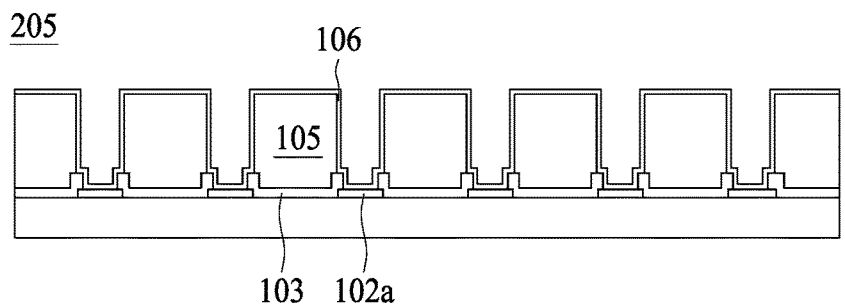
FIG. 3E is a schematic view of a semiconductor device with an electric conductive layer in accordance with some embodiments.

In operation 205, the conductive pad 102a, the passivation 103 and the polymeric material 105 are surrounded with an electric conductive layer 106 as in FIG. 3E. In some embodiments, the electric conductive layer 106 is disposed by electroplating or deposition. In some embodiments, the electric conductive layer 106 is formed by sputtering and configured as a seed layer for the conductor. The electric conductive layer 106 is a thin film to be disposed inside the opening 105a and lines along the exposed surfaces of the opening 105a. A portion of the electric conductive layer 106 also covers the conductive pad 102a. The forming operation of the electric conductive layer 106 may further include two sub-operations to form layers 106a and 106b in FIG. 2 separately. Layers 106a and 106b may be formed in-situ or independently, and the micro structure between these two layers are distinguishable under analysis tools like TEM (Transmission Electron Microscope) or SEM (Scanning Electron Microscope).

Figure 3F:
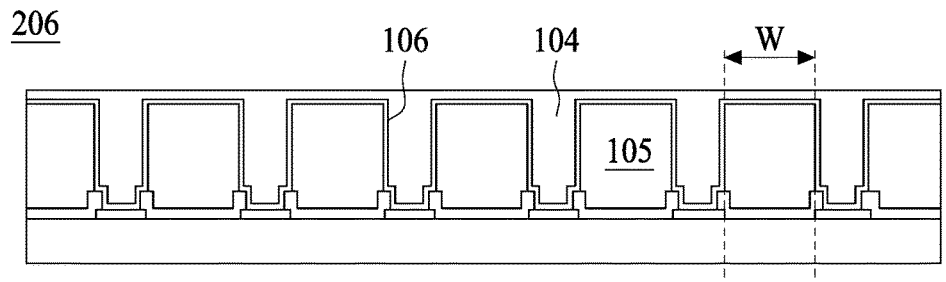
FIG. 3F is a schematic view of a semiconductor device with a conductor in accordance with some embodiments.

In operation 206, a conductor 104 is disposed over and adjacent to the electric conductive layer 106 as in FIG. 3F. Because the conductor 104 is formed after the opening 105a is defined, the spacing W of the conductors can be determined by the width and spacing of the polymeric material 105. The advantage to perform a filling-first (forming the pattern of polymeric material before forming the conductor 104) operation is to ensure the gap filling quality between adjacent conductors 104. The filling-first operation can satisfy the requirement for small spacing conductor, for example, when W is less than 10 um. The polymeric material 105 used as a conductor gap filling may have viscosity range from 1 to 1000 Pa·s. If the polymeric material 105 is filled into the conductor gap after the formation of small spacing conductors, the flow resistance of the polymeric material 105 may lead to a poor gap filling, such as voids, between the conductors. The poor gap filling quality does not only an issue for visual defect; it also contributes to some fatal reliability failures. The filling-first operation disclosed in the present disclosure provides a solution to eliminate the undesired poor gap filling issue. Because the polymeric material 105 is blanket coated over the semiconductor substrate prior to forming any uneven surface features (such as conductor array), the gap filling capability of the polymeric material 105 becomes insignificant to the device defect and reliability quality. It should be also appreciated that since the opening 105a is formed by a photolithography operation, the dimension for the opening 105a (for a conductor 104 to be disposed therein) can be reduced with the advanced exposure technology. Therefore, a small spacing conductor 104 (W<10 um) requirement can be satisfied by the filling-first operation. In some embodiments, the conductor 104 is disposed by various methods such as electroplating, sputtering or etc. In some embodiments, the conductor 104 includes a metal such as copper.

Figure 3G:
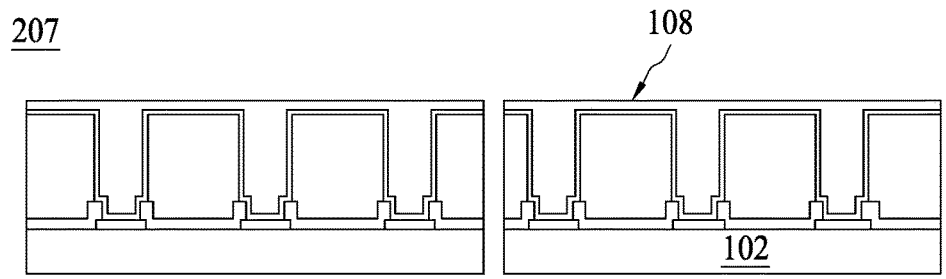
FIG. 3G is a schematic view of a semiconductor device with singulated die in accordance with some embodiments.

In operation 207, the semiconductor substrate 102 is singulated into several individual dies 108 as in FIG. 3G. In some embodiments, the semiconductor substrate 102 is singulated by a mechanical or laser blade.

Figure 3H:
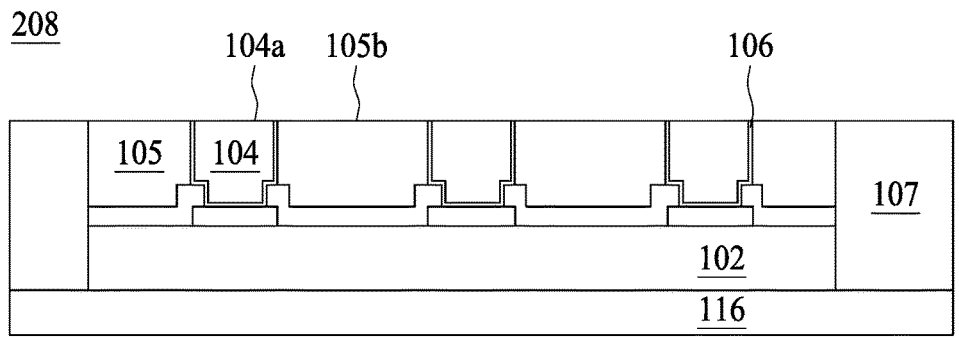
FIG. 3H is a schematic view of a semiconductor device with a carrier and molding in accordance with some embodiments.

In operation 208, the die 108 singulated from the semiconductor substrate 102 is placed on a carrier 116. A molding 107 is disposed on the carrier 116 to surround the die 108. A removal or planarization operation is introduced to remove a portion of the molding 107 in order to expose the top surface 104a of the conductor 104 and a top surface 105b of the polymeric material 105, such that there is no molding 107 remaining on the conductor 104 and the polymeric material. FIG. 3H is an embodiment showing the structure after the removal operation. In some embodiments, the top portion of the molding 107, the conductor 104, and the electric conductive layer 106 are concurrently removed by an operation such as etching or grinding in order to be coplanar In operation 209, a polymer 109 is disposed over molding 107, the conductor 104 and the polymeric material 105 as in FIG. 3I. In some embodiments, the polymer 109 includes a polymeric material such as epoxy, polyimide, polybenzoxazole (PBO), solder resist (SR), ABF film, and the like.

Figure 3I:
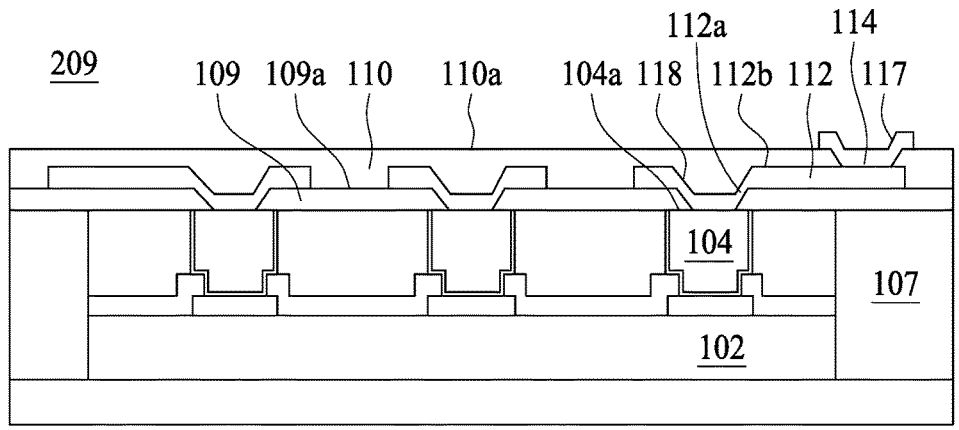
FIG. 3I is a schematic view of a semiconductor device with redistribution layers, polymers, and a bond pad in accordance with some embodiments.

A recessed portion 118 is formed above the top surface 104a of the conductor 104 as in FIG. 3I. In some embodiments, some of the polymer 109 above the top surface 104a are removed by photolithography.

A first redistribution layer (RDL) 112 is disposed as in FIG. 3I. In some embodiments, the first RDL 112 is disposed on the polymer 109 by electroplating or sputtering. In some embodiments, the first RDL 112 includes an extended portion 112a extending from the top surface 109a of the polymer 109 to the top surface 104a of the conductor 104. The extended portion 112a is disposed along the recessed portion 118. The first RDL 112 is electrically connected with the conductor 104 through the top surface 104a and the extended portion 112a.

A polymer 110 is disposed as in FIG. 3I. In some embodiments, the polymer 110 is disposed on the first RDL 112. The polymer 110 covers the top of the semiconductor device 100. In some embodiments, the polymer 110 includes a polymeric material such as epoxy, polyimide, polybenzoxazole (PBO), solder resist (SR), ABF film, and the like.

A via 117 is formed and a bond pad 114 is disposed as in FIG. 3I. In some embodiments, the via 117 is formed by removing some of the polymer 110 above the first RDL 112. In some embodiments, some of the polymer 110 is removed by photolithography to form the via 117. In some embodiments, the via 117 is in a tapered configuration. In some embodiments, the via 117 is extended from a top surface 110a of the polymer 110 to an end portion 112b of the first RDL 112.

In some embodiments, the bond pad 114 is formed above the end portion 112b of the first RDL and the polymer 110. In some embodiments, the bond pad 114 fills the via 117 and extends from the top surface 110a of the polymer 110 to the end portion 112b of the first RDL, so that the bond pad 114 is electrically connected with the first RDL 112. In some embodiments, the bond pad 114 is an under bump metallurgy (UBM) pad which is a solderable surface for receiving a bump and electrically connecting the bond pad 114 with the circuitry external to the die 108.

Figure 3J:
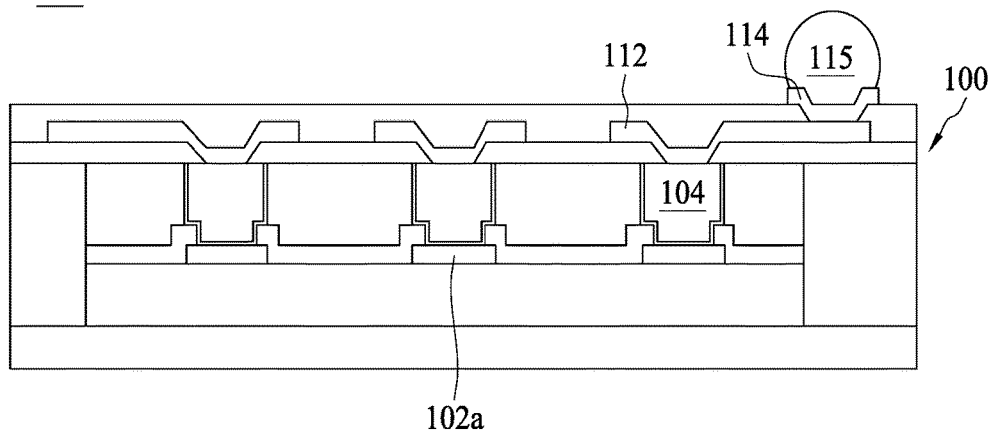
FIG. 3J is a schematic view of a semiconductor device with a bump in accordance with some embodiments.

In operation 210, a bump 115 is disposed on the bond pad 114 as in FIG. 3J. In some embodiments, the bump 115 is a solder bump, solder ball, solder paste or etc. In some embodiments, the bump 115 is configured for attaching with a pad on another die, another substrate or another semiconductor package. In some embodiments, the bump 115 is a conductive bump or a conductive joint. In some embodiments, the conductive pad 102a is electrically connected with the bump 115 through the conductor 104, the first RDL 112 and the bond pad 114.

Figure 3K:
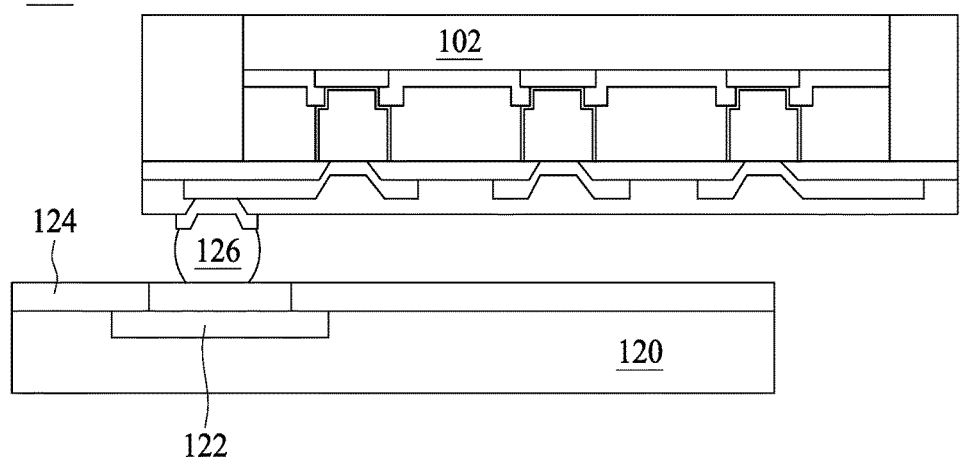
FIG. 3K is a schematic view of a semiconductor device without a carrier bonding with another die or another package in accordance with some embodiments.

In operation 211, the carrier 101 is removed from the semiconductor device 100 as in FIG. 3K. In some embodiments, the semiconductor device 100 is detached from the carrier 101 for subsequent operations.

The structure shown in FIG. 3J is flipped upside down and attached to another substrate 120 at the bottom of FIG. 3K. The substrate 120 may be a package substrate, board (e.g., a printed circuit board (PCB)), a wafer, a die, an interposer substrate, or other suitable substrate. The bump structure is coupled to the substrate 120 through various conductive attachment points. For example, a conductive region 122 is formed and patterned on the substrate 120. The conductive region 122 is a contact pad or a portion of a conductive trace, which is presented by a mask layer 124. In one embodiment, the mask layer 124 is a solder resist layer formed and patterned on the substrate 120 to expose the conductive region 122. The mask layer 124 has a mask opening, which provides a window for solder joint formation. For example, a solder layer including alloys of tin, lead, silver, copper, nickel, bismuth, or combinations thereof may be provided on the conductive region 122. The semiconductor device 100 can be coupled to the substrate 120 through a joint solder structure 126 between the bond pad 114 and the conductive region 122. An exemplary coupling process includes a flux application, chip placement, reflowing of melting solder joints, and/or cleaning of flux residue. The semiconductor substrate 102, the joint solder structure 126, and the other substrate 120 may be referred to as a packaging assembly, or in the present embodiment, a flip-chip packaging assembly.

In some embodiments, a method of manufacturing a semiconductor device, comprising: providing a semiconductor substrate including a conductive pad disposed thereon; disposing a polymeric material over the semiconductor substrate and the conductive pad; patterning the polymeric material to form an opening exposing at least a portion of the conductive pad; disposing a conductive layer over the polymeric material and the portion of the conductive pad; and forming a conductor over the portion of the conductive pad and within the opening.

In some embodiments, the disposing the polymeric material is performed prior to the disposing the conductive layer. In some embodiments, the conductive layer is disposed between the conductor and the polymeric material. In some embodiments, the conductive layer is disposed conformal to an outer surface of the polymeric material. In some embodiments, the conductor is isolated from polymeric material. In some embodiments, the patterning the polymeric material includes removing a portion of the polymeric material disposed over the portion of the conductive pad. In some embodiments, the method further comprises disposing a passivation over the semiconductor substrate, wherein the portion of the conductive pad is exposed from the passivation. In some embodiments, the polymeric material is disposed on the passivation. In some embodiments, the method further comprises forming an oxide compound between the conductive layer and the polymeric material. In some embodiments, the width of the opening is between about 10 um and about 100 um.

In some embodiments, a method of manufacturing a semiconductor device, comprising: providing a semiconductor substrate including a conductive pad disposed thereon; disposing a passivation over the semiconductor substrate and a portion of the conductive pad; disposing a polymeric material over the passivation; disposing a conductive layer conformally over the polymeric material and the portion of the conductive pad exposed there-from; forming a conductor over the portion of the conductive pad and laterally surrounded by the polymeric material; and forming a molding to surround the semiconductor substrate and the polymeric material.

In some embodiments, the polymeric material is disposed on the passivation before the forming the conductor over the portion of the conductive pad. In some embodiments, the conductive layer is disposed between the conductor and the polymeric material upon the forming the molding. In some embodiments, the polymeric material comprises a viscosity greater than about 1 Pa·s. In some embodiments, the disposing the polymeric material and the patterning the polymeric material are performed prior to the forming the conductor.

In some embodiments, a method of manufacturing a semiconductor device, comprising: providing a semiconductor substrate including a conductive pad disposed thereon; disposing a passivation over the semiconductor substrate and a portion of the conductive pad; disposing a polymeric material over the passivation and the portion of the conductive pad; removing a portion of the polymeric material to form an opening exposing the portion of the conductive pad; disposing a conductive layer over the polymeric material, the portion of the conductive pad and a sidewall of the opening; disposing a conductive material over the conductive layer and within the opening; removing a portion of the conductive material and a portion of the conductive layer disposed over the polymeric material to form a conductor within the opening and surrounded by the conductive layer.

In some embodiments, the removing the portion of the conductive material and the portion of the conductive layer includes grinding operations. In some embodiments, the disposing the conductive layer includes disposing a first layer over the polymeric material, the portion of the conductive pad and the sidewall of the opening, and disposing a second layer over the first layer. In some embodiments, the conductor is disposed over the portion of the conductive pad. In some embodiments, the method further comprises singulating the semiconductor substrate into a plurality of dies; forming a molding to surround the semiconductor structure and the polymeric material; forming a redistribution layer over the molding, the polymeric material, the conductive layer and the conductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    providing a semiconductor substrate including a conductive pad disposed thereon;
    disposing a polymeric material over the semiconductor substrate and the conductive pad;
    patterning the polymeric material to form an opening exposing at least a portion of the conductive pad;
    disposing a conductive layer over the polymeric material and the portion of the conductive pad;
    forming a conductor over the portion of the conductive pad and within the opening; and
    removing a portion of the conductor and a portion of the conductive layer to expose the polymeric material.

2. The method of claim 1, wherein the disposing the polymeric material is performed prior to the disposing the conductive layer.

3. The method of claim 1, wherein the conductive layer is disposed between the conductor and the polymeric material.

4. The method of claim 1, wherein the conductive layer is disposed conformal to an outer surface of the polymeric material.

5. The method of claim 1, wherein the conductor is isolated from polymeric material.

6. The method of claim 1, wherein the patterning the polymeric material includes removing a portion of the polymeric material disposed over the portion of the conductive pad.

7. The method of claim 1, further comprising disposing a passivation over the semiconductor substrate, wherein the portion of the conductive pad is exposed from the passivation.

8. The method of claim 7, wherein the polymeric material is disposed on the passivation.

9. The method of claim 1, further comprising forming an oxide compound between the conductive layer and the polymeric material.

10. The method of claim 1, wherein the width of the opening is between about 10 um and about 100 um.

11. A method of manufacturing a semiconductor device, comprising:
    providing a semiconductor substrate including a conductive pad disposed thereon;

disposing a passivation over the semiconductor substrate and a portion of the conductive pad;

disposing a polymeric material over the passivation;

disposing a conductive layer conformally over the polymeric material and the portion of the conductive pad exposed there-from;

forming a conductor over the portion of the conductive pad and laterally surrounded by the polymeric material;

forming a molding to surround the semiconductor substrate and the polymeric material; and removing a portion of the molding, a portion of the conductor, and a portion of the conductive layer to expose the polymeric material.

12. The method of claim 11, wherein the polymeric material is disposed on the passivation before the forming the conductor over the portion of the conductive pad.

13. The method of claim 11, wherein the conductive layer is disposed between the conductor and the polymeric material upon the forming the molding.

14. The method of claim 11, wherein the polymeric material comprises a viscosity greater than about 1 Pa·s.

15. The method of claim 11, wherein the disposing the polymeric material and the patterning the polymeric material are performed prior to the forming the conductor.

16. A method of manufacturing a semiconductor device, comprising:

providing a semiconductor substrate including a conductive pad disposed thereon;

disposing a passivation over the semiconductor substrate and a portion of the conductive pad;

disposing a polymeric material over the passivation and the portion of the conductive pad;

removing a portion of the polymeric material to form an opening exposing the portion of the conductive pad;

disposing a conductive layer over the polymeric material, the portion of the conductive pad and a sidewall of the opening;

disposing a conductive material over the conductive layer and within the opening;

removing a portion of the conductive material and a portion of the conductive layer disposed over the polymeric material to form a conductor within the opening and surrounded by the conductive layer; and disposing a polymer over the conductor and the polymeric material after forming the conductor.

17. The method of claim 16, wherein the removing the portion of the conductive material and the portion of the conductive layer includes grinding operations.

18. The method of claim 16, wherein the disposing the conductive layer includes disposing a first layer over the polymeric material, the portion of the conductive pad and the sidewall of the opening, and disposing a second layer over the first layer.

19. The method of claim 16, wherein the conductor is disposed over the portion of the conductive pad.

20. The method of claim 16, further comprising:

singulating the semiconductor substrate into a plurality of dies;

forming a molding to surround the semiconductor structure and the polymeric material;

forming a redistribution layer over the molding, the polymeric material, the conductive layer and the conductor.

* * * * *